United States Patent
Haroun et al.

(10) Patent No.: US 7,915,905 B2
(45) Date of Patent: Mar. 29, 2011

(54) PROCESS AND TEMPERATURE INSENSITIVE FLICKER NOISE MONITOR CIRCUIT

(75) Inventors: Baher S. Haroun, Allen, TX (US); Gaurav Chandra, Richardson, TX (US); Vijaya Bhaskar Rentala, Plano, TX (US); Venkatesh Srinivasan, Dallas, TX (US); Hisashi Shichijo, Plano, TX (US); Krishnaswamy Nagaraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/761,544

(22) Filed: Apr. 16, 2010

(65) Prior Publication Data

US 2010/0197053 A1 Aug. 5, 2010

Related U.S. Application Data

(62) Division of application No. 12/061,409, filed on Apr. 2, 2008, now Pat. No. 7,719,299.

(51) Int. Cl.
  *G01R 31/00* (2006.01)

(52) U.S. Cl. ............................. 324/750.3; 324/762.05
(58) Field of Classification Search .................. None
  See application file for complete search history.

(56) References Cited

U.S. PATENT DOCUMENTS

| 5,648,661 | A  | * | 7/1997 | Rostoker et al. | ............... 257/48 |
| 7,171,334 | B2 | * | 1/2007 | Gassner | ....................... 702/182 |
| 7,220,990 | B2 | * | 5/2007 | Aghababazadeh et al. | ..... 257/48 |
| 7,723,724 | B2 | * | 5/2010 | Aghababazadeh et al. | ..... 257/48 |

* cited by examiner

*Primary Examiner* — Vinh P Nguyen
(74) *Attorney, Agent, or Firm* — Ronald O. Neerings; Wade James Brady, III; Frederick J. Telecky, Jr.

(57) ABSTRACT

In an apparatus and method for monitoring defects in wafers, a monitoring circuit is fabricated on an area of each one of the wafers. The monitoring circuit includes representative devices that replicate similar devices located in a die area of the wafers. Defects if present in the representative devices contribute to a generation of a noise, thereby causing an imbalance in a differential signal measurable across selected ones of the representative devices. A digitizing circuit that uses a common mode voltage as a reference to measure the imbalance digitizes the differential signal to a digital signal, the digital signal being indicative of the noise generated by the defects. The digital signal is stored over a configurable time interval to form a digital bit stream. The digital bit stream is compared to a reference to determine whether the defeats are within an allowable range.

12 Claims, 5 Drawing Sheets

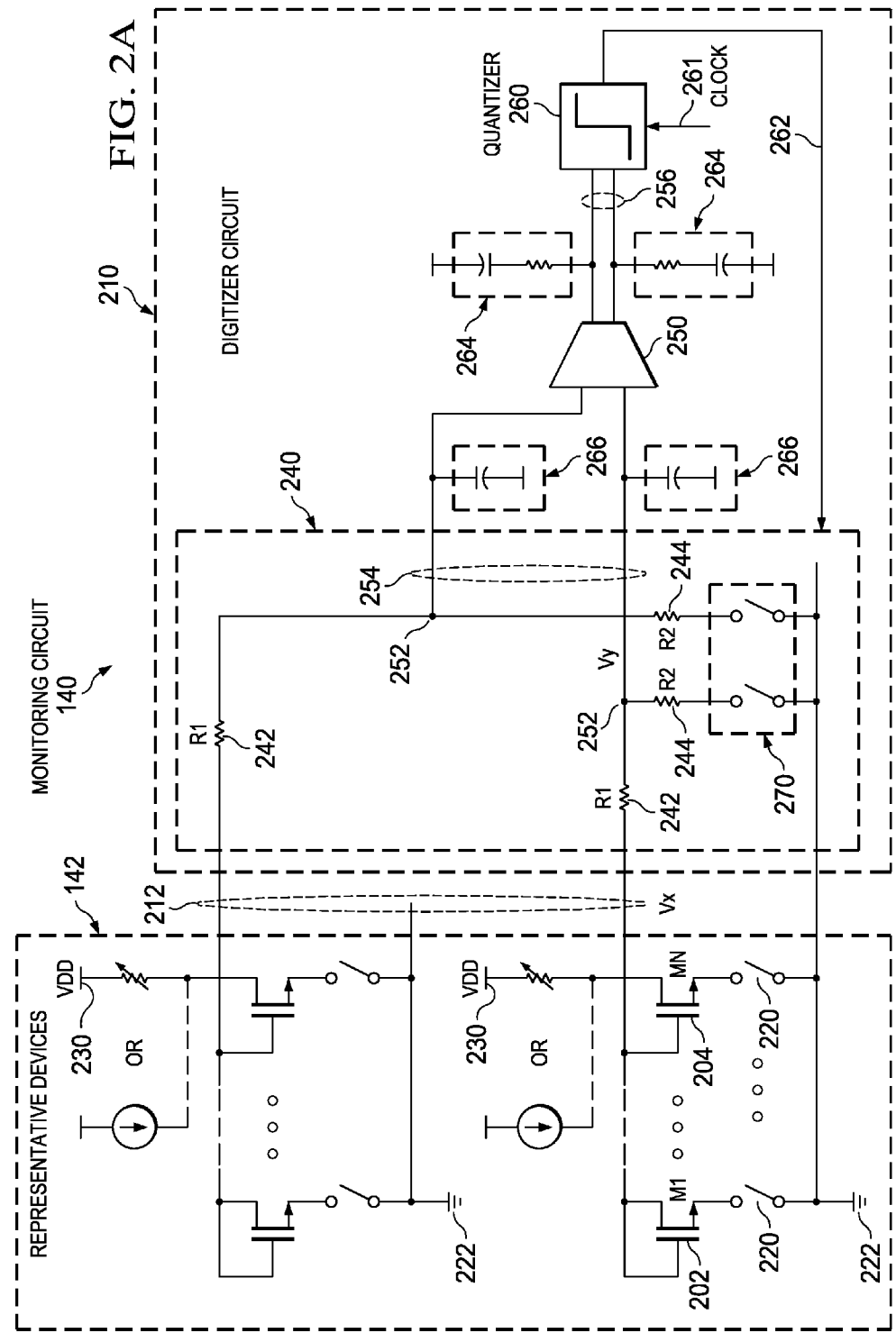

PROCESS AND TEMPERATURE INSENSITIVE FLICKER NOISE MONITOR CIRCUIT

This application is a Divisional of application Ser. No. 12/061,409 filed Apr. 2, 2008 now U.S. Pat. No. 7,719,299.

BACKGROUND

The present disclosure relates generally to integrated circuit (IC) manufacturing, and more particularly to a method and an apparatus for measuring flicker noise (also referred to as 1/f noise) generated by defects present in an IC manufacturing environment.

The flicker noise is a type of electronic noise occurring mostly at low frequencies in virtually all electronic devices. Unlike thermal noise that has constant power amplitude over the frequency spectrum, the flicker noise decreases with frequency. The flicker noise is typically caused by material or process defects (or both) present in the IC manufacturing environment. The flicker noise is often used as a figure-of-merit (FOM) for comparing performances of semiconductor devices.

Ongoing scaling of semiconductor device dimensions, including the introduction of new channel materials and device structures, is having a significant impact on noise performance metrics. In particular, the flicker noise being intrinsically related to the interface properties is expected to be impacted by deep sub-micron technologies, especially in analog, mixed signal, and radio frequency (RF) circuits.

A traditional solution for measuring flicker noise properties of transistors in a production environment is typically based on fabrication of test circuits on a wafer and the use of highly sensitive, low noise amplifiers to measure the low frequency noise signals. The testing is typically performed in a more stringent measurement environment that is different than the production environment. However, since this technique relies on amplification and measurement of very low level analog signals, the measurement results are often erroneous, costly to obtain, and unreliable.

SUMMARY

Applicants recognize that the traditional approach to measuring the flicker noise caused by material defects or process defects or both in a production environment is often time consuming, cumbersome, and involves several manual steps requiring operator actions. Noise measurement data collected by the highly sensitive instrumentation amplifiers is often limited to a few wafer batches and may not represent the actual distribution, deviation or spread in the flicker noise encountered in all wafer batches produced by the wafer manufacturing line. Since data collection is limited to a few sampled wafers, an IC designer may often include large margins in the device models, thereby resulting in less than optimal area and power performance of the device.

Applicants also recognize that the test circuits included in the traditional solution may be susceptible to changes in process, voltage, and temperature. That is, test circuit parameters such as gain may change with process, voltage, and temperature, thereby introducing inherent inaccuracies in the noise measurement setup. Applicants further recognize that flicker noise is found to cumulatively increase from one production node of the wafer manufacturing line to the next.

Hence, it would be desirable to obtain a timely and an accurate measurement and characterization of the flicker noise in the production process that may lead to a tighter control of the manufacturing process, thereby leading increased production yield. Therefore, it would be desirable to provide an improved noise monitoring circuit used in an IC production environment that achieves measurement (and subsequent digitization) of the low frequency noise signals while maintaining the measurement to be substantially independent of process, voltage, and temperature. Accordingly, it would be desirable to provide a method and apparatus for an improved manufacturing process control technique based on the measurement of flicker noise, absent the disadvantages found in the prior methods discussed above.

The foregoing needs are addressed by the teachings of the present disclosure, which relates to an apparatus and method for an improved monitoring circuit for monitoring defects in a production environment. According to one embodiment, in an apparatus and method for monitoring defects in wafers, a monitoring circuit is fabricated on an area of each one of the wafers. The monitoring circuit includes representative devices that replicate similar devices located in a die area of the wafers. Defects if present in the representative devices contribute to a generation of a noise, thereby causing an imbalance in a differential signal measurable across selected ones of the representative devices. A digitizing circuit that uses a common mode voltage as a reference to measure the imbalance digitizes the differential signal to a digital signal, the digital signal being indicative of the noise generated by the defects. The digital signal is stored over a configurable time interval to form a digital bit stream. The digital bit stream is compared to a reference to determine whether the defects are within an allowable range.

In one aspect of the disclosure, a digitizer circuit for monitoring defects in a production environment includes a pair of switched resistive divider circuit, a differential amplifier, and a quantizer. The pair of switched resistive divider circuit includes a pair of first resistors coupled to receive a pair of differential analog input signals, a pair of second resistors coupled to the pair of first resistors to form a pair of differential input nodes, and a pair of switches coupled between the pair of second resistors and a voltage reference node. The pair of switches control a current flow through the pair of second resistors. The differential amplifier is coupled to the pair of differential input nodes to receive a pair of differential output signals and provide a pair of current output signals. The pair of differential output signals are a configurable ratio of the pair of differential analog input signals that are generated by a presence of the defects. The quantizer is coupled to receive the pair of current output signals and provide a digital signal corresponding to the pair of differential analog input signals. The digital signal is used to control the pair of switches.

In another aspect of the disclosure, a wafer having a built-in defect monitoring circuit includes a plurality of dies that include different types of semiconductor devices. The built-in monitoring circuit for monitoring the defects is electrically isolated from the plurality of dies. The monitoring circuit includes a plurality of devices under test (DUT) electrically coupled to a digitizer circuit. The plurality of DUT replicates similar semiconductor devices located in the plurality of dies. A defect such as a material defect or a manufacturing process generated defect or both if present in the DUT generates a noise measurable as a pair of differential analog input signals. The digitizer circuit is operable to digitize the pair of differential analog input signals and generate a digital signal. Digital signals corresponding to multiple wafers included in a production run are generated as a digital bit stream over a configurable time interval. The digital bit stream is compared to a reference to determine whether the number of defects is within allowable limits.

Several advantages are achieved by the method and apparatus according to the illustrative embodiments presented herein. The embodiments provide an improved apparatus and method for reducing manufacturing defects in wafer production. A monitoring circuit is advantageously built-in a wafer, e.g., included in a scribe area that does not use valuable die area on the wafer. The monitoring circuit includes representative devices that replicate similar devices located in the die area of the wafers. Defects if present in the representative devices contribute to a generation of a noise, thereby causing an imbalance in a differential signal measurable across selected ones of the representative devices. A digitizing circuit that uses a common mode voltage as a reference to measure the imbalance digitizes the differential signal to a digital signal, the digital signal being indicative of the noise generated by the defects. Therefore, the measurement of the noise is substantially independent of process, voltage, and temperature. Once the differential signal has been digitized any further processing is advantageously independent of the use of any sensitive instrumentation amplifiers. The digital signal is stored over a configurable time interval to form a digital bit stream. The digital bit stream is advantageously proportional to a value of the noise generated by the defects present in the DUT. The digital bit stream is compared to a reference to determine whether the defects are within an allowable range. In addition to measuring flicker noise, the monitoring circuit may also be advantageously used to measure mismatches between two devices or characterize noise across temperature without having to use sensitive amplifiers. The improved apparatus and method for reducing manufacturing defects in wafers advantageously quantifies the noise measurement and provides a tighter process control, thereby resulting in improving wafer quality and yield. The improved apparatus and method also provides measurement results are accurate, cost effective, and reliable.

BRIEF DESCRIPTION OF THE DRAWINGS

FIG. 2A illustrates a block diagram of a monitoring circuit described with reference to FIGS. 1A, 1B, and 1C, according to an embodiment;

DETAILED DESCRIPTION

Figure 1A:
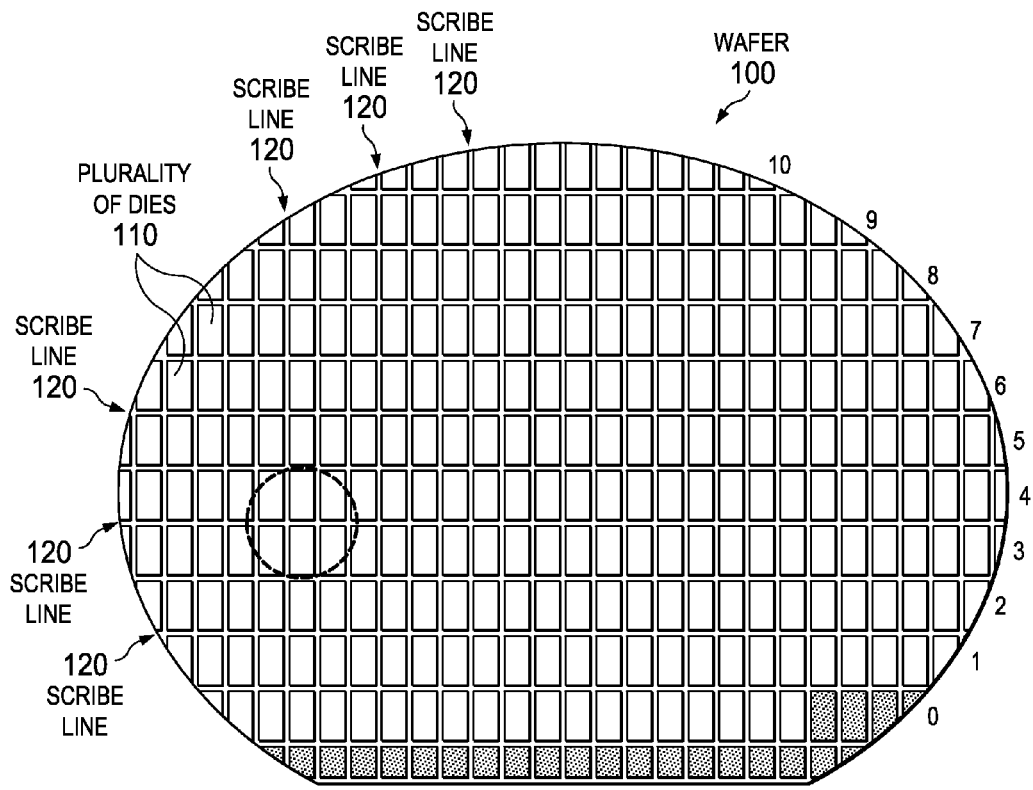
FIG. 1A illustrates a layout diagram of an improved semiconductor wafer, according an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

As described earlier, a traditional solution for measuring flicker noise properties of transistors in a production environment is typically based on fabricating test circuits on a wafer and using highly sensitive, low noise amplifiers to measure the low frequency noise signals. The testing is typically performed in a more stringent measurement environment that is different than the production environment. However, since this technique relies on amplification and measurement of very low level analog signals, the measurement results are often erroneous, costly to obtain, and unreliable. Therefore, a need exists to provide a method and apparatus for measuring flicker noise caused by defects. This problem may be addressed by an apparatus and method for an improved manufacturing process control technique based on the measurement of flicker noise.

According to one embodiment, in an apparatus and method for monitoring defects in wafers, a monitoring circuit is fabricated on an area of each one of the wafers. The monitoring circuit includes representative devices that replicate similar devices located in a die area of the wafers. Defects if present in the representative devices contribute to a generation of a noise, thereby causing an imbalance in a differential signal measurable across selected ones of the representative devices. A digitizing circuit that uses a common mode voltage as a reference to measure the imbalance digitizes the differential signal to a digital signal, the digital signal being indicative of the noise generated by the defects. The digital signal is stored over a configurable time interval to form a digital bit stream. The digital bit stream is compared to a reference to determine whether the defects are within an allowable range.

The following terminology may be useful in understanding the present disclosure. It is to be understood that the terminology described herein is for the purpose of description and should not be regarded as limiting.

Wafer—A thin slice with parallel faces cut from a semiconductor material.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a wafer may be configured to have a scribe width of 50 micrometers, the allowable range of the scribe width being between 10 micrometers and 100 micrometers.

Manufacturing defect—A defect introduced during a manufacturing, assembly, or packaging process of the element. Circuit elements such as capacitors, resistors, transistors, current sources, and similar others, are often mismatched due to presence of non-idealities or defects in the manufacturing process such as variations in manufacturing process, imperfections in materials used, changes in temperature, humidity, degradation, and similar other factors. Examples of a manufacturing defect caused by imperfections in materials and changes in process environment may include an oxide trap, which manifests itself directly as noise. Flicker noise is a notable example of one such phenomenon. Other types of manufacturing defects causing variations in manufacturing process across the die area may include non-uniform doping profiles, among others. These type of defects often cause the circuit elements such as capacitors, resistors, transistors, current sources, and similar others, to be mismatched, thereby causing non-linearity in the circuit properties, which manifests itself as signal distortion and noise.

An apparatus in the form of an improved wafer having a built-in monitoring circuit that is operable to measure noise generated by defects if present in the wafer is described with reference to FIGS. 1A, 1B and 1C. Additional detail of the monitoring circuit is described with reference to FIGS. 2A and 2B. A method for monitoring defects in wafers is described with reference to FIG. 3.

FIG. 1A illustrates a layout diagram of an improved semiconductor wafer 100, according to an embodiment. The wafer 100 includes a plurality of dies (also referred to an IC chips) 110 separated by scribe lines 120 (also referred to as scribe streets). FIG. 1B illustrates additional detail of the plurality of dies 110 separated by the scribe lines 120 (shown in a circle), according to an embodiment. Referring to FIGS. 1A and 1B, the plurality of dies 110 are generally arranged in a matrix array. The scribe lines 120 are used to scribe and cut the wafer 100 into individual dies. That is, during wafer singulation, the plurality of dies 100 are cut or sawed along the scribe lines 120 to provide the individual dies. In an exemplary, non-depicted embodiment, the plurality of dies 110 include a plurality of individual circuit elements such as transistors, capacitors, resistors, and similar others that are interconnected to perform a particular function.

The process of cutting or sawing the wafer 100 may induce stress, thereby potentially causing damage to the plurality of dies 110. To reduce the possibility of the damage, dimensions of the cut along ascribe line may be adjusted. For example, a width of the cut may be configured to provide a sufficient cutting margin for cutting tools having various widths.

In the depicted embodiment, an area 130 of the wafer 100 is selected to fabricate a monitoring circuit 140. It is understood that any area of the wafer 100 that is different than and non-overlapping to the plurality of dies 110 may be selected. The monitoring circuit 140 includes representative devices 142 (also referred to as devices under test (DUT)) to replicate similar devices, e.g., individual circuit elements such as transistors, capacitors, resistors, and similar others, located in the plurality of dies 110. In a particular embodiment, the area 130 is a scribe area selected along one or more of the scribe lines 120, the scribe area being protected by a scribe seal (not shown). Thus, the area 130 is selectable to be non-overlapping to and electrically isolated from the plurality of dies 110. In a particular embodiment, the area 130 having a shape resembling a rectangle has a street width 132 that is configurable between approximately 10 micrometers and approximately 100 micrometers, e.g., 50 micrometers. A length of the shape resembling the rectangle may be configurable in accordance with the dimensions of the wafer 100. It is understood that additional areas of the wafer 100 having shapes that are different than rectangular, may be selected as described with reference to FIG. 1C.

In a particular embodiment, the area 130 is within a configurable distance from a selectable one of the plurality of dies 110. The proximity of the area 130 to the selectable one of the plurality of dies 110 advantageously ensures substantial uniformity of the material and process used to fabricate the individual circuit elements in the plurality of dies 110 and the representative devices 142 in the monitoring circuit 140. That is, defects in material or process or both if present in the individual circuit elements are also very likely to be present in the representative devices 142.

Figure 1B:
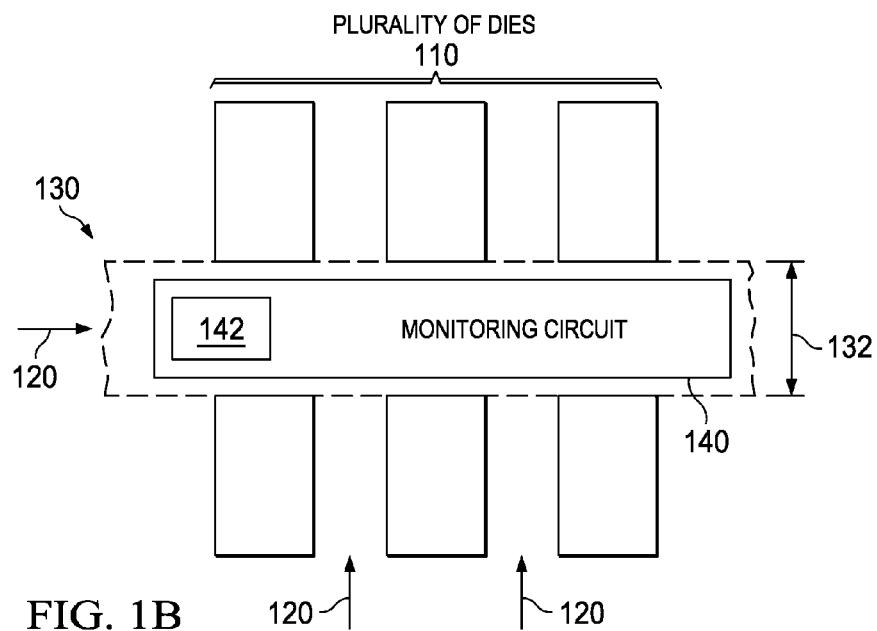
FIG. 1B illustrates additional detail of a plurality of dies separated by scribe lines, according an embodiment.
Figure 1C:
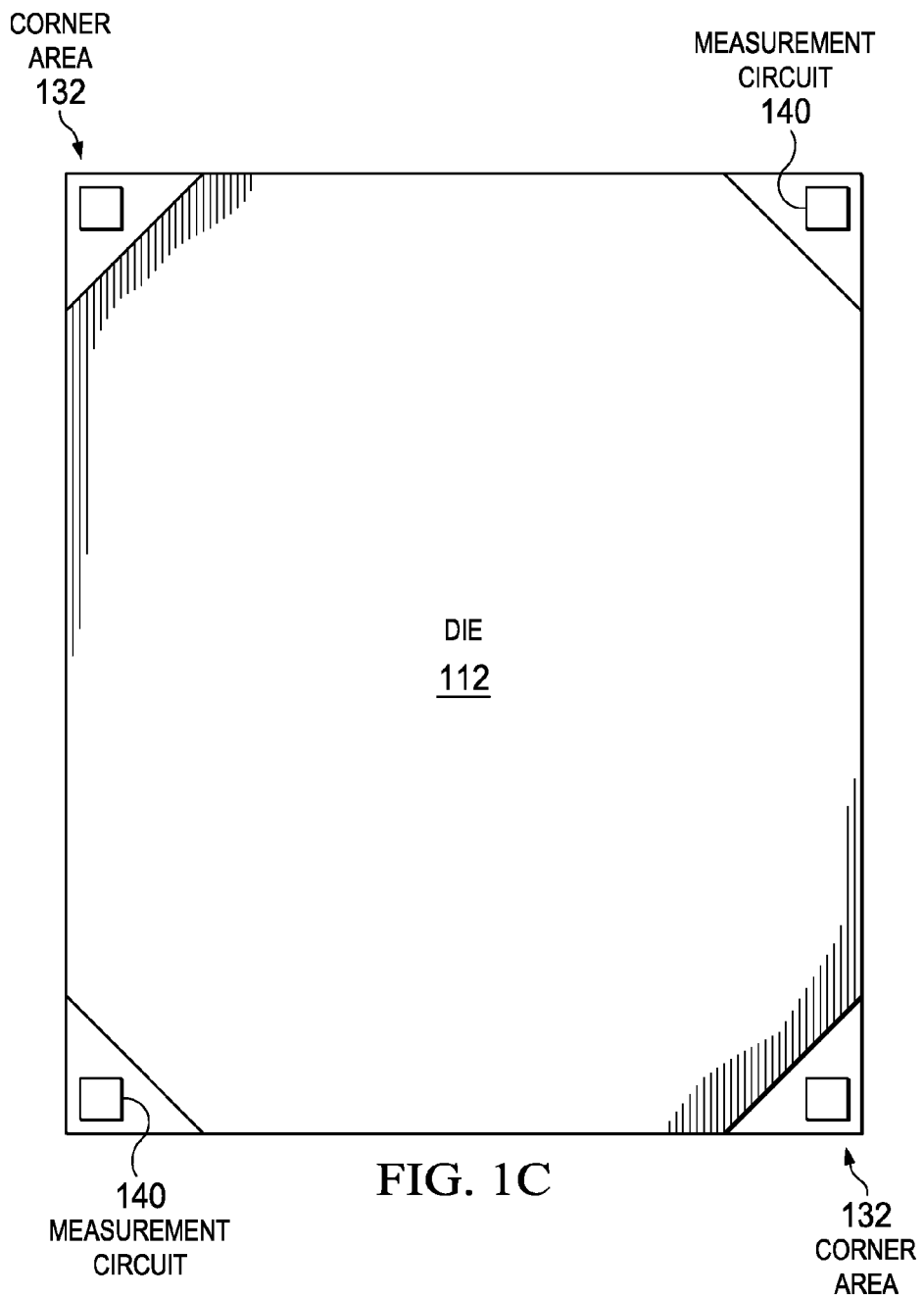
FIG. 1C illustrates a monitoring circuit located in corner areas corresponding to each corner of a die, according to an embodiment.

FIG. 1C illustrates a monitoring circuit located in corner areas corresponding to each corner of a die, according to an embodiment. In the depicted embodiment, a die 112 of the plurality of dies 110 has a sloped corner area rather than traditional 90 degree corners in order to reduce induced stress. A corner area 132 having a shape resembling a right angled triangle is selectable corresponding to each corner of the die 112 to include the monitoring circuit 140.

Referring to FIGS. 1A, 1B, and 1C, the monitoring circuit 140 is operable to monitor defects present in the representative devices 142 by measuring changes to the electrical properties, e.g., voltages, caused by the defects. The measured electrical properties including any changes thereto are converted to a digital signal. In a particular embodiment, the wafer 100 including the measurement circuit 140 is fabricated, the electrical measurements for monitoring the defects are obtained by the measurement circuit 140, and the digital signal is stored in memory before the wafer 100 is cut and singulated. Additional detail of the monitoring circuit 140 is described with reference to FIGS. 2A, 2B and 2C.

FIG. 2A illustrates a block diagram of the monitoring circuit 140 described with reference to FIGS. 1A, 1B, and 1C, according to an embodiment. The monitoring circuit 140 includes representative devices 142 coupled to a digitizer circuit 210. In the depicted embodiment, the representative devices 142 are n-channel field effect transistors (FET) M1 202 and MN 204. The representative devices 142 may be configured as an array of devices under test (DUT) that are individually selectable to operate by opening or closing switches 220 coupled between a source of the FET and a voltage reference 222 such as ground. A power supply VDD 230 provides power to the representative devices 142. In the depicted embodiment, the representative devices 142 are configured as a diode, e.g., by coupling the gate and the drain of the n-FET, in a measurement or test mode of operation. It is understood that other types of transistors and other circuit elements may be included in the representative devices 142.

The digitizer circuit 210 is coupled to receive a pair of differential analog input signals 212 from selected ones of the representative devices 142, the selection being controlled by the switches 220. The pair of differential analog input signals 212 (referred to as simply differential signals) may be received as current or voltage signals. As described earlier, defects if present in the representative devices 142 generate a mismatch in the electrical properties of the selected ones of the representative devices 142. For example, a differential drain-to-source voltage across two pairs of ideally matched transistors (defect free and noise free) is measured as 0 volts. As another example, on-resistance of two ideally matched transistors is measured to be the same. A defect or mismatch present in at least one of the transistors causes an imbalance in the electrical properties, thereby generating a low frequency flicker noise. The imbalance causes a change in value of the differential voltage from 0 volts to a non-zero volt value, e.g., a positive or negative value. Therefore, the flicker noise is measurable as a change in the differential voltage signal relative to an initial reference value (may also be referred to as common mode reference) such as 0 volts. In a particular embodiment, the initial reference value may be measured, e.g., by a direct current (DC) voltage measurement device, when the representative devices 142 receive power from the VDD 230 power source. Alternatively, the initial reference value may be empirically derived, may be derived from reference data on matched components used as a benchmark without making an initial measurement, or may be measured by simply shorting the input terminals of the digitizer circuit 210. The process of obtaining an initial reference value may be referred to an initialization process or a calibration process.

The digitizer circuit 210 includes a pair of switched resistive divider circuit 240, a differential amplifier 250, and a quantizer 260. In a particular embodiment, the differential amplifier 250 and the quantizer 260 may be implemented as a sigma delta modulator (SDM) circuit. The SDM circuit advantageously provides a high dynamic range, especially for low frequency signals. The pair of switched resistive divider circuit 240 includes a pair of first resistors (pair of R1) 242 coupled to receive the pair of differential analog input signals 212 (with each one of the first resistors being coupled in series with a corresponding input of a differential pair of inputs). A pair of second resistors (pair of R2) 244 is coupled to the pair of first resistors 242 to form a pair of differential input nodes 252. A pair of switches 270 is coupled between the pair of second resistors 244 and the voltage reference node 222. The pair of switches 270 control a current flow through the pair of second resistors 244.

The differential amplifier 250 is coupled to the pair of differential input nodes 252 to receive a pair of differential output signals 254 and provide a pair of current output signals 256. The pair of differential output signals 254 are provided by the pair of switched resistive divider circuit 240 as a configurable ratio (computed as a function of the first resistor and the second resistor) of the pair of differential analog input signals 212. In a particular embodiment, the differential amplifier 250 is an operational transconductance amplifier (OTA) having a gain gm. The quantizer 260 is coupled to receive the pair of current output signals 256 and provide a digital signal 262 corresponding to the pair of differential analog input signals 212. Therefore, the digital signal 262 is indicative of the noise generated by the defects. The quantizer 260 is coupled to receive a clock 261 signal, which may be generated by an on-board clock circuit (not shown). In a particular embodiment, the clock 261 signal may have a frequency selectable between approximately 50 megahertz to approximately 100 megahertz. Additional frequency ranges in the radio frequency (RF) range may be selectable. A frequency of the digital signal 262 may be in accordance with the clock 261.

In a particular embodiment, the digital signal 262 is output as a 1-bit signal, e.g., expressed in a logical high state or a logical low state. It is understood that the digital signal 262 may be output as a multi-bit signal. The digital signal 262 is used to control the pair of switches 270. In a particular embodiment, the digital signal 262 is stored in memory (not shown, may be located on-board or off-board) over a configurable time interval to form a digital bit stream (also referred to as a digital code sequence). Further analysis of the digital bit stream may be performed to take corrective action for reducing the defects, as required. For example, the digital bit stream may be compared to a reference, e.g., a reference digital bit stream pattern, to determine whether the defects are within an allowable range. The allowable range may be configured in accordance with six sigma quality objectives, e.g., 1 defect per million units.

The self-referencing feature of the digitizer circuit 210 is provided by controlling the pair of switches 270 with the digital signal 262. The feedback resistors (pair of second resistors 244) of the SDM loop are switched to ground or are left open in dependence of the output of the quantizer 260, e.g., the digital signal 262. That is, when the digital signal 262 is high the pair of switches 270 are closed, thereby enabling a current flow through the pair of second resistors 244 to the ground, and disabling the current flow through the pair of second resistors 244 to the ground when the digital signal 262 is low. Thus, the current flowing through the pair of second resistors 244 (which is the feedback current of the SDM circuit) is proportional to the voltage Vy measurable at one of the pair of differential input nodes 252 divided by a value of the second resistor R2 of the pair of second resistors 244. The current flowing through the pair of second resistors 244 is equal to, on the average, an input noise current. The input noise current is proportional to an input noise voltage Vx (measurable at one of the input terminals that receives one of the pair of differential analog input signals 212) divided by the input first resistor R1 of the pair of first resistors 242. Thus, $$(Vx/R1)=(Vy/R2)*<D> \qquad \text{Equation 100}$$

where <D> is the average value of the digital bit stream measured over the configurable time interval.

The digital bit stream is indicative of the flicker noise measurable as the pair of differential analog input signals 212. For example, the digital bit stream includes an equal number of logic high (1's) and logic low (0's) signals generated over the configurable time interval in response to the pair of differential analog input signals 212 being equal to 0 volts. The digital bit stream includes all logic high signals generated over the configurable time interval in response to the pair of differential analog input signals 112 being equal to a positive full scale (FS) value. The digital bit stream includes all logic low signals generated over the configurable time interval in response to the pair of differential analog input signals 212 being equal to a negative full scale value.

The reference voltage of an analog-to-digital (A/D) converter is particularly important to the overall performance of the circuit, since the input signal is expressed as a digital fraction of the reference voltage and any change in the reference voltage due to process, voltage, temperature (PVT) or noise may have a direct impact on the digitization process. In the depicted embodiment, the voltage Vy advantageously serves as the reference voltage. However, since Vy is developed internally it may not be directly measurable. The voltage Vy is advantageously expressed as a known resistor ratio of the voltage Vx as shown in equation 200, (which is obtained by solving the common mode current equations)

$$Vy=Vx*(2R2/(R1+2R2)) \qquad \text{Equation 200}$$

Therefore, measurement of voltage Vy is accomplished by measuring voltage Vx. The voltage Vx may be easily measured, e.g., by a direct current (DC) voltage measurement device, since the DUT is excited by a known off-chip bias current or by the voltage VDD 230 with a known variable resistor. Thus, the reference voltage Vy of the digitizer circuit 210 is measurable by simply measuring Vx and with a configurable ratio of resistances R1 and R2, the reference voltage of the digitizer circuit 210 is known for each measurement.

The digitizer circuit 210 is advantageously self-referenced and independent of PVT changes, since the digital signal 262 output of the digitizer circuit 210 is primarily dependent on the reference voltage Vy (which as described earlier is derived from the measurement of Vx, e.g., measurable by an accurate DC voltage measurement device, and the known resistor ratio) and is less dependent of other variable parameters of the digitizer 210 such as gm, input bias current, and similar others]. This is because the amplifier 250, quantizer 260, and the resistors R2 and R1 constitute a feedback loop to achieve sigma-delta modulation. The amplifier 250 and the passive components (Rx, Cx) 264 and Cy 266 create a loop filter, which integrates (or accumulates) the difference between the input signal and the feedback signal 262, and provides it to the quantizer 260. Thus a feedback configuration of the digitizer circuit 210, ensures that over a long period of time, the value of the output bit stream accurately reflects the average (or low frequency) value of the input signal. The exact values of gm and the passive components 264 and 266 are relatively less important since they only affect the loop filter gain and the transfer function, which have a relatively small impact on the overall accuracy, provided the loop gain is large. Hence, the flicker noise measurement is accurate and substantially independent of the process, voltage, and temperature variation experienced by the digitizer circuit 210. Therefore, the bias voltage Vy present at one of the pair of differential input nodes 252 advantageously serves as an on-board or on-chip reference voltage for the digitizer circuit 210.

Figure 2B:
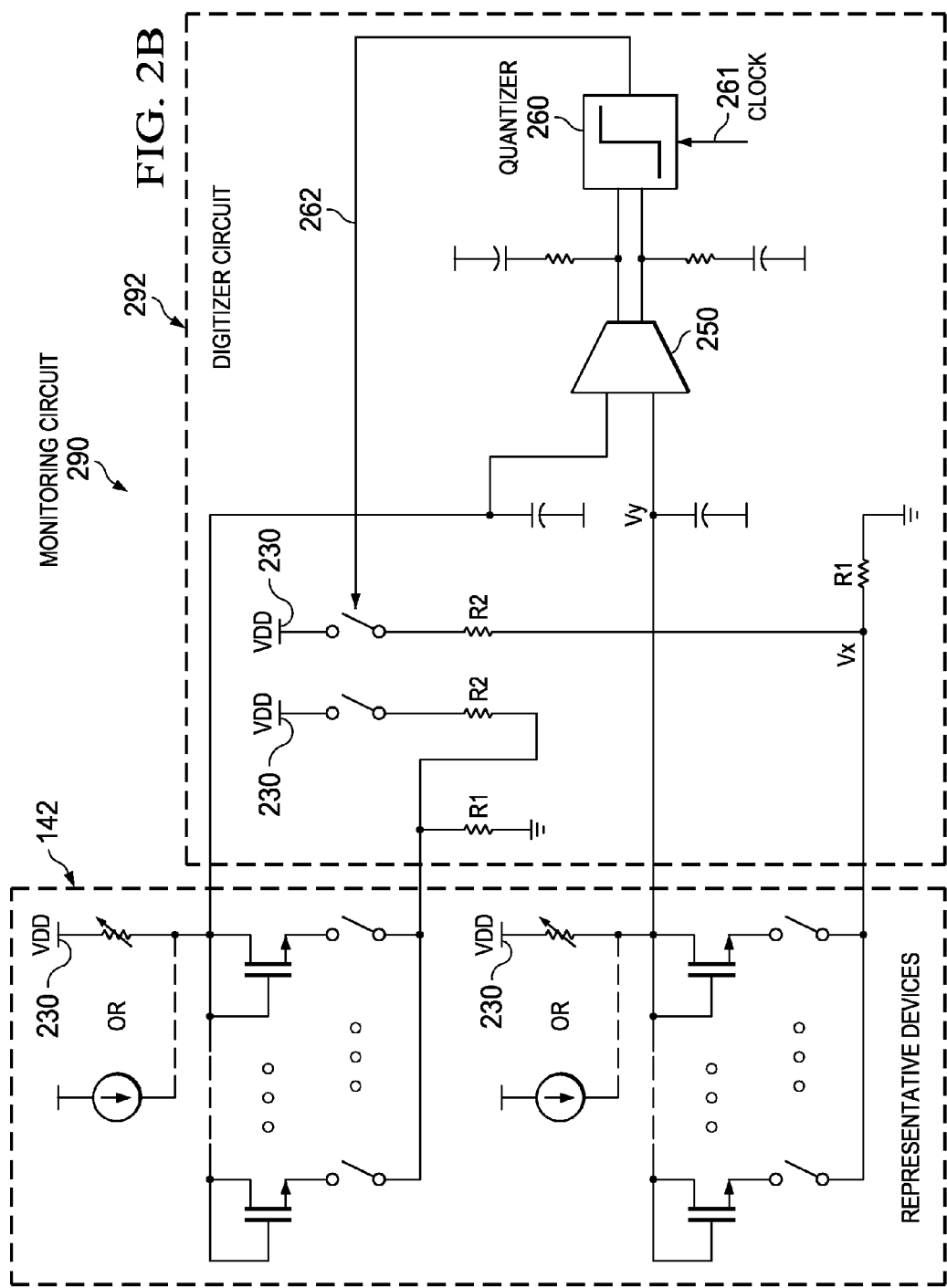
FIG. 2B illustrates a block diagram of a monitoring circuit using a power supply voltage as a reference, according to an embodiment.

FIG. 2B illustrates a block diagram of a monitoring circuit 290 using a power supply voltage as a reference, according to an embodiment. The monitoring circuit 290 is substantially similar to the monitoring circuit 140 described with reference to FIG. 2A except for the use of a power supply source voltage used as a reference. The monitoring circuit 290 uses VDD 230 as a reference and the voltage Vx is computed by the equation 300:

$$Vx = VDD * (R1/(R1+R2))$$  Equation 300

In the depicted embodiment, the internal reference Vy of the digitizer circuit 292 is shown to be directly proportional to the supply voltage VDD 230.

Figure 3:
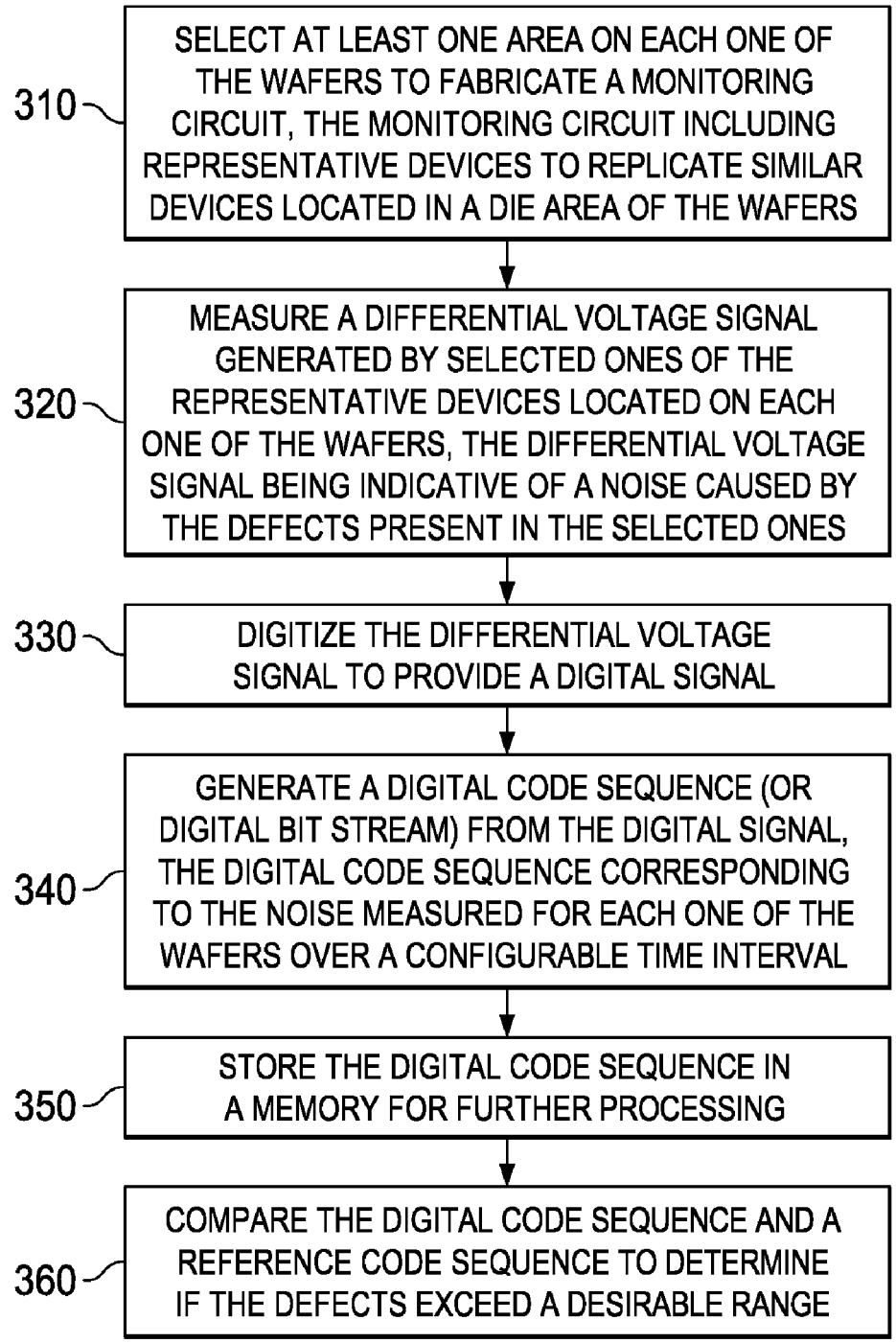
FIG. 3 illustrates a flow chart of a method for monitoring defects in wafers, according to an embodiment.

FIG. 3 illustrates a flow chart 300 of a method for monitoring defects in wafers, according to an embodiment. In a particular embodiment, the method is used to monitor defects in multiple ones of the wafer 100 described with reference to FIGS. 1A and 1B. At step 310, at least one area on each one of the wafers is selected to fabricate a monitoring circuit. The monitoring circuit includes representative devices to replicate similar devices located in a die area of the wafers. At step 320, a differential voltage signal generated by selected ones of the representative devices located on each one of the wafers is measured, the differential voltage signal being indicative of a noise caused by the defects present in the selected ones. At step 330, the differential voltage signal is digitized to provide a digital signal, the digitizing being performed by the monitoring circuit. At step 340, a digital code sequence (or digital bit stream) is generated from the digital signal, the digital code sequence corresponding to the noise measured for each one of the wafers over a configurable time interval. At step 350, the digital code sequence is stored in a memory for further processing.

Various steps described above may be added, omitted, combined, altered, or performed in different orders. For example, step 360 may be added to generate an alarm. At step 360, a comparison is made between the digital code sequence and a reference code sequence to determine if the defects exceed a desirable range.

Several advantages are achieved by the method and apparatus according to the illustrative embodiments presented herein. The embodiments provide an improved apparatus and method for reducing manufacturing defects in wafer production. A monitoring circuit is advantageously built-in a wafer, e.g., included in a scribe area that does not use valuable die area on the wafer. The monitoring circuit includes representative devices that replicate similar devices located in the die area of the wafers. Defects if present in the representative devices contribute to a generation of a noise, thereby causing an imbalance in a differential voltage signal measurable across selected ones of the representative devices. A digitizing circuit that uses a common mode voltage as a reference to measure the imbalance digitizes the differential voltage signal to a digital signal, the digital signal being indicative of the noise generated by the defects. Therefore, the measurement of the noise is substantially independent of process, voltage, and temperature. Once the differential voltage signal has been digitized any further processing is advantageously independent of the use of any sensitive instrumentation amplifiers. The digital signal is stored over a configurable time interval to form a digital bit stream. The digital bit stream is advantageously proportional to a value of the noise generated by the defects present in the DUT. The digital bit stream is compared to a reference to determine whether the defects are within an allowable range. In addition to measuring flicker noise, the monitoring circuit may also be advantageously used to measure mismatches between two devices or characterize noise across temperature without having to use sensitive amplifiers. The improved apparatus and method for reducing manufacturing defects in wafers advantageously quantifies the noise measurement and provides a tighter process control, thereby resulting in improving wafer quality and yield. The improved apparatus and method also provides measurement results are accurate, cost effective, and reliable.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of detecting a flicker noise using on-board measurement circuits, those of ordinary skill in the art will appreciate that the apparatus and methods disclosed herein are capable of detecting any defects including mismatch between two devices. As another example, while certain aspects of the present disclosure have been described in the context of using a noise monitoring circuit having differential inputs, those of ordinary skill in the art will appreciate that the apparatus and methods disclosed herein are capable of being implemented with single ended inputs.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for monitoring defects in wafers, the method comprising:
   selecting at least one area on each one of the wafers to fabricate a monitoring circuit, wherein the monitoring circuit includes representative devices to replicate similar devices located in a die area of the wafers;
   measuring a differential signal generated by selected ones of the representative devices located on each one of the wafers, the differential signal being indicative of a noise caused by the defects present in the selected ones; and
   digitizing the differential signal to provide a digital signal, the digitizing being performed by the monitoring circuit.

2. The method of claim 1 further comprising:
   generating a digital code sequence from the digital signal, the digital code sequence corresponding to the noise measured for each one of the wafers over a configurable time interval; and
   storing the digital code sequence.

3. The method of claim 2, wherein the digital code sequence is stored in a corresponding one of the wafers.

4. The method of claim 2 further comprising:
   comparing the digital code sequence to a reference code sequence to determine if the noise is within an allowable range.

5. The method of claim 1, wherein the monitoring circuit includes the representative devices electrically coupled to a digitizer circuit, wherein the digitizer circuit is operable to digitize the differential signal.

6. The method of claim 5, wherein the measuring includes:
   configuring the selected ones to operate as a diode; and
   calibrating the digitizer circuit, wherein the calibrating provides initial power to the representative devices, thereby enabling the selected ones to generate a common mode voltage used as a reference for subsequent measurements.

7. The method of claim 6, wherein the noise is measured as a ratio of the common mode voltage.

8. The method of claim 6, wherein the measuring of the noise as the ratio of the common mode voltage is substantially independent of a process, voltage, and temperature variation experienced by the digitizer circuit.

9. The method of claim 1, wherein the differential signal is 0 volts, the 0 volts being indicative of an absence of the noise.

10. The method of claim 1, wherein the at least one area is a scribe area, the scribe area being electrically isolated from the die area.

11. The method of claim 10, wherein the scribe area is within a configurable distance from the die area.

12. The method of claim 1, wherein the noise is a flicker noise, the flicker noise being generated by the defects present in a material or a process used to fabricate the wafers.

* * * * *